United States Patent
Okuno et al.

(10) Patent No.: US 12,529,018 B2
(45) Date of Patent: Jan. 20, 2026

(54) METHOD FOR CLEANING SEMICONDUCTOR SUBSTRATE, METHOD FOR PRODUCING PROCESSED SEMICONDUCTOR SUBSTRATE, AND STRIPPING COMPOSITION

(71) Applicant: NISSAN CHEMICAL CORPORATION, Tokyo (JP)

(72) Inventors: Takahisa Okuno, Toyama (JP); Masaki Yanai, Toyama (JP); Takuya Fukuda, Toyama (JP); Hiroto Ogata, Toyama (JP); Shunsuke Moriya, Toyama (JP); Hiroshi Ogino, Toyama (JP); Tetsuya Shinjo, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 577 days.

(21) Appl. No.: 17/913,639

(22) PCT Filed: Mar. 22, 2021

(86) PCT No.: PCT/JP2021/011677
§ 371 (c)(1),
(2) Date: Sep. 22, 2022

(87) PCT Pub. No.: WO2021/193518
PCT Pub. Date: Sep. 30, 2021

(65) Prior Publication Data
US 2023/0151306 A1    May 18, 2023

(30) Foreign Application Priority Data
Mar. 23, 2020   (JP) .................. 2020-050956

(51) Int. Cl.
 C11D 7/24   (2006.01)
 C11D 7/32   (2006.01)
 H01L 21/02  (2006.01)
 H01L 21/304 (2006.01)

(52) U.S. Cl.
 CPC ............ *C11D 7/247* (2013.01); *C11D 7/3281* (2013.01); *H01L 21/02068* (2013.01); *C11D 2111/22* (2024.01); *H01L 21/304* (2013.01)

(58) Field of Classification Search
 CPC . H01L 2221/68327; H01L 2221/68324; H01L 21/02057; H01L 21/6836; H01L 21/31133; C11D 7/5004
 See application file for complete search history.

(56) References Cited

U.S. PATENT DOCUMENTS

| | | | |
|---|---|---|---|
| 6,818,608 B2 | 11/2004 | Moore | |
| 2011/0136321 A1 | 6/2011 | Kuroda et al. | |
| 2017/0200628 A1 | 7/2017 | Kamibayashi et al. | |
| 2018/0012751 A1 | 1/2018 | Kamochi et al. | |
| 2023/0131533 A1 | 4/2023 | Okuno et al. | |

FOREIGN PATENT DOCUMENTS

| | | |
|---|---|---|
| EP | 4 130 224 A1 | 2/2023 |
| KR | 10-2018-0066550 A | 6/2018 |
| WO | WO 2014/092022 A1 | 6/2014 |
| WO | WO 2015/190438 A1 | 12/2015 |
| WO | WO 2016/152598 A1 | 9/2016 |

OTHER PUBLICATIONS

ESR for EP App. No. 21774115.6, dated Mar. 1, 2024.
ISR for PCT/JP2021/011677, dated Jun. 1, 2021 (w/ translation).
IPRP for PCT/JP2021/011677, dated Sep. 22, 2022 (w/ translation).

*Primary Examiner* — Alexander G Ghyka
(74) *Attorney, Agent, or Firm* — Greenblum & Bernstein, P.L.C.

(57) ABSTRACT

The invention provides a semiconductor substrate cleaning method including a step of removing an adhesive layer provided on a semiconductor substrate by use of a remover composition, wherein the remover composition contains a solvent but no salt; and the solvent includes an organic solvent represented by formula (L) (in the formula, L represents a substituent to the benzene ring, and each of a plurality of Ls represents a C1 to C4 alkyl group; and k represents the number of Ls and is an integer of 0 to 5) in an amount of 80 mass % or more.

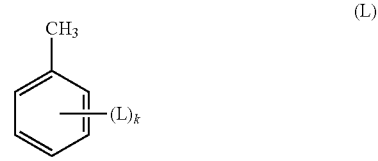

18 Claims, No Drawings

METHOD FOR CLEANING SEMICONDUCTOR SUBSTRATE, METHOD FOR PRODUCING PROCESSED SEMICONDUCTOR SUBSTRATE, AND STRIPPING COMPOSITION

TECHNICAL FIELD

The present invention relates to a method for cleaning a semiconductor substrate (hereinafter may be referred to as a "semiconductor substrate cleaning method"), to a method for producing a processed semiconductor substrate (hereinafter may be referred to as a "processed semiconductor substrate production method"), and to a composition for removing an adhesive layer (hereinafter may be referred to simply as a "remover composition").

BACKGROUND ART

Conventionally, electronic elements and wires are 2-dimensionally (within a plane) integrated on a semiconductor wafer. In a trend toward further integration, demand has arisen for a semiconductor integration technique which achieves 3-dimensional integration (i.e., stacking) in addition to 2-dimensional integration. In the technique of 3-dimensional integration, a number of layers are stacked with wire connection by the mediation of through silicon vias (TSVs). In integration of multiple layers, each component wafer to be stacked is thinned by polishing (i.e., grinding) a surface opposite the circuit-furnished surface (i.e., a back surface), and the thus-thinned semiconductor wafers are stacked.

Before thinning, the semiconductor wafer (may also be called simply "wafer") is fixed to a support for facilitating polishing by means of a polishing machine (i.e., grinder). Since the fixation must be easily removed after polishing, the fixation is called temporary bonding. Temporary bonding must be easily removed from the support. When such temporary bonding is removed by excessive force, in some cases a thinned semiconductor wafer may be broken or deformed. In order to prevent such a phenomenon, the temporarily bonded support is detached in a gentle manner. However, from another aspect, it is not preferred that the temporarily bonded support be removed or slid by a stress applied during polishing of the back surface of the semiconductor wafer. Therefore, temporary bonding must withstand the stress during polishing and must be easily removed after polishing. For example, one required performance includes having high stress (i.e., strong adhesion) toward the plane direction during polishing and low stress (i.e., weak adhesion) toward the thickness direction (i.e., the direction crossing the plane direction) during detaching. Also, temporary bonding must withstand heat, since the temperature of such a wafer is 150° C. or higher in some processing steps.

Under such circumstances, polysiloxane adhesives meeting the aforementioned characteristic requirements are mainly used as temporary adhesives in the semiconductor industry. In temporary bonding by use of a polysiloxane adhesive, an adhesive residue often remains on a substrate surface after removal of the thinned substrate. In order to avoid an undesired phenomenon in a subsequent step, there has been developed a cleaning agent composition for removing such a residue and cleaning the surface of a semiconductor substrate (see, for example, Patent Documents 1 and 2). Patent Document 1 discloses a siloxane resin-remover containing a polar, aprotic solvent and a quaternary ammonium hydroxide, and Patent Document 2 discloses a cured resin-remover containing an alkylammonium fluoride. However, in the current industrial field of semiconductors, there is continuous demand for a new cleaning composition, namely, an effective cleaning composition and method.

Meanwhile, a semiconductor wafer is electrically connected to semiconductor chips by the mediation of, for example, bump balls formed of a metallic conductive material. By use of chips having such bump balls, the dimensions of a semiconductor package product are reduced.

In this respect, bump balls formed of a metal such as copper or tin, which has poor corrosion resistance, are problematically damaged by a cleaning composition for removing adhesive residue remaining on a support or a wafer (see Patent Document 3). Thus, one requirement in such a cleaning composition and method is to prevent corrosion of bump balls during cleaning of a substrate.

PRIOR ART DOCUMENTS

Patent Documents

Patent Document 1: WO 2014/092022
Patent Document 2: U.S. Pat. No. 6,818,608
Patent Document 3: Korean Patent Application Laid-Open 2018-0066550

SUMMARY OF THE INVENTION

Problems to be Solved by the Invention

The present invention has been conceived under such circumstances. Thus, an object of the invention is to provide a semiconductor substrate cleaning method for suitably and easily removing an adhesive layer formed by use of, for example, a siloxane adhesive, from a semiconductor substrate having the adhesive layer on a surface thereof, while damage to bumps provided on the semiconductor substrate is reduced or inhibited. Another object is to provide a processed semiconductor substrate production method including such a cleaning method. Still another object is to provide a remover composition for use in the cleaning method.

Means for Solving the Problems

The present inventors have conducted extensive studies in order to solve the aforementioned problems, and have found that an adhesive layer provided on a semiconductor substrate can be efficiently and easily removed from the semiconductor substrate by use of a remover composition containing, as a solvent, a specific aromatic hydrocarbon compound in an amount greater than a specific level and containing no salt, while damage to bumps provided on the semiconductor substrate is reduced or inhibited. Particularly, the adhesive layer is a cured film obtained from a siloxane adhesive containing polyorganosiloxane component (A) which is curable through hydrosilylation. The present invention has been accomplished on the basis of this finding.

Accordingly, the present invention provides the following.

1. A semiconductor substrate cleaning method comprising a step of removing an adhesive layer provided on a semiconductor substrate by use of a remover composition, characterized in that
   the remover composition contains a solvent but no salt; and the solvent includes an organic solvent represented by formula (L):

[F1]

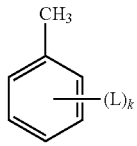

(L)

(wherein L represents a substituent to the benzene ring, and each of a plurality of Ls represents a C1 to C4 alkyl group; and k represents the number of Ls and is an integer of 0 to 5) in an amount of 80 mass % or more.

2. A semiconductor substrate cleaning method according to claim 1, wherein the solvent includes the organic solvent represented by formula (L) in an amount of 85 mass % or more.

3. A semiconductor substrate cleaning method according to 2 above, wherein the solvent is formed of the organic solvent represented by formula (L).

4. A semiconductor substrate cleaning method according to any of 1 to 3 above, wherein L is a methyl group or an isopropyl group.

5. A semiconductor substrate cleaning method according to 1 above, wherein the organic solvent represented by formula (L) is at least one species selected from among toluene, mesitylene, p-cymene, and 1,2,4-trimethylbenzene.

6. A semiconductor substrate cleaning method according to any of 1 to 5 above, wherein the adhesive layer is a film formed by use of an adhesive composition which contains an adhesive component (S) containing at least one species selected from among a siloxane adhesive, an acrylic resin adhesive, an epoxy resin adhesive, a polyamide adhesive, a polystyrene adhesive, a polyimide adhesive, and a phenolic resin adhesive.

7. A semiconductor substrate cleaning method according to 6 above, wherein the adhesive component (S) contains a siloxane adhesive.

8. A semiconductor substrate cleaning method according to 7 above, wherein the siloxane adhesive contains a polyorganosiloxane component (A) which is curable through hydrosilylation.

9. A processed semiconductor substrate production method comprising:
a first step of producing a laminate having a semiconductor substrate, a support substrate, and an adhesive layer formed from an adhesive composition;
a second step of processing the semiconductor substrate of the produced laminate;
a third step of separating the semiconductor substrate and the adhesive layer from the support substrate; and
a fourth step of removing the adhesive layer on the semiconductor substrate by use of a remover composition, characterized in that
the remover composition contains a solvent but no salt; and
the solvent includes an organic solvent represented by formula (L):

[F2]

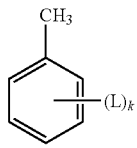

(L)

(wherein L represents a substituent to the benzene ring, and each of a plurality of Ls represents a C1 to C4 alkyl group; and k represents the number of Ls and is an integer of 0 to 5) in an amount of 80 mass % or more.

10. A processed semiconductor substrate production method according to 9 above, wherein the solvent includes the organic solvent represented by formula (L) in an amount of 85 mass % or more.

11. A processed semiconductor substrate production method according to 10 above, wherein the solvent is formed of the organic solvent represented by formula (L).

12. A processed semiconductor substrate production method according to any of 9 to 11 above, wherein L is a methyl group or an isopropyl group.

13. A processed semiconductor substrate production method according to 12 above, wherein the organic solvent represented by formula (L) is at least one species selected from among toluene, mesitylene, p-cymene, and 1,2,4-trimethylbenzene.

14. A processed semiconductor substrate production method according to any of 9 to 13 above, wherein the adhesive layer is a film formed by use of an adhesive composition which contains an adhesive component (S) containing at least one species selected from among a siloxane adhesive, an acrylic resin adhesive, an epoxy resin adhesive, a polyamide adhesive, a polystyrene adhesive, a polyimide adhesive, and a phenolic resin adhesive.

15. A processed semiconductor substrate production method according to 14 above, wherein the adhesive component (S) contains a siloxane adhesive.

16. A processed semiconductor substrate production method according to 15 above, wherein the siloxane adhesive contains a polyorganosiloxane component (A) which is curable through hydrosilylation.

17. A remover composition for use in removal of an adhesive layer provided on a semiconductor substrate during cleaning the semiconductor substrate, which composition contains a solvent but no salt, characterized in that
the solvent includes an organic solvent represented by formula (L):

[F3]

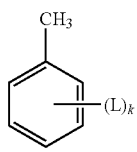

(L)

(wherein L represents a substituent to the benzene ring, and each of a plurality of Ls represents a C1 to C4 alkyl group; and k represents the number of Ls and is an integer of 0 to 5) in an amount of 80 mass % or more.

18. A remover composition according to 17 above, wherein the solvent includes the organic solvent represented by formula (L) in an amount of 85 mass % or more.
19. A remover composition according to 18 above, wherein the solvent is formed of the organic solvent represented by formula (L).
20. A remover composition according to any of 17 to 19 above, wherein L is a methyl group or an isopropyl group.
21. A remover composition according to 20 above, wherein the organic solvent represented by formula (L) is at least one species selected from among toluene, mesitylene, p-cymene, and 1,2,4-trimethylbenzene.
22. A remover composition according to any of 17 to 21 above, wherein the adhesive layer is a film formed by use of an adhesive composition which contains an adhesive component (S) containing at least one species selected from among a siloxane adhesive, an acrylic resin adhesive, an epoxy resin adhesive, a polyamide adhesive, a polystyrene adhesive, a polyimide adhesive, and a phenolic resin adhesive.
23. A remover composition according to 22 above, wherein the adhesive component (S) contains a siloxane adhesive.
24. A remover composition according to 23 above, wherein the siloxane adhesive contains a polyorganosiloxane component (A) which is curable through hydrosilylation.

Effects of the Invention

Through employment of the semiconductor substrate cleaning method of the present invention, an adhesive layer formed by use of, for example, a siloxane adhesive can be suitably and easily removed from a semiconductor substrate having the adhesive layer on a surface thereof. Thus, high-efficiency production of favorable semiconductor elements is expected.

Particularly when the semiconductor substrate has an adhesive layer and bumps, the adhesive layer can be suitably and easily removed, while damage to bumps provided on the semiconductor substrate is reduced or inhibited. Thus, high-efficiency, high-reliability production of favorable semiconductor elements is expected.

MODES FOR CARRYING OUT THE INVENTION

The semiconductor substrate cleaning method of the present invention includes a step of removing an adhesive layer provided on a semiconductor substrate by use of a remover composition. In the method, the remover composition contains a solvent but no salt, and the solvent includes an organic solvent represented by formula (L) in an amount of 80 mass % or more.

[F4]

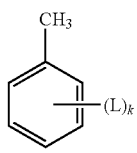

(L)

The semiconductor substrate is, for example, a wafer. Specific examples of the wafer include, but are not limited to, a silicon wafer having a diameter of about 300 mm and a thickness of about 770 μm.

The adhesive layer provided on the semiconductor substrate is a film which is formed from an adhesive composition containing, for example, an adhesive component (S).

No particular limitation is imposed on the adhesive component (S), so long as it is used in this technical field. Examples of the adhesive component (S) include a siloxane adhesive, an acrylic resin adhesive, an epoxy resin adhesive, a polyamide adhesive, a polystyrene adhesive, a polyimide adhesive, and a phenolic resin adhesive.

Among them, a siloxane adhesive is preferred as the adhesive component (S), since it exhibits suitable adhesion performance in processing of a wafer or the like, can be suitably removed after processing, and has excellent heat resistance.

In a preferred embodiment, the adhesive composition of the present invention contains, as an adhesive component, a polyorganosiloxane component (A) which is curable through hydrosilylation. In a more preferred embodiment, the polyorganosiloxane component (A) which is curable through hydrosilylation contains a polysiloxane (A1) having one or more units selected from the group consisting of a siloxane unit represented by $SiO_2$ (unit Q), a siloxane unit represented by $R^1R^2R^3SiO_{1/2}$ (unit M), a siloxane unit represented by $R^4R^5SiO_{2/2}$ (unit D), and a siloxane unit represented by $R^6SiO_{3/2}$ (unit T), and a platinum group metal catalyst (A2); wherein the polysiloxane (A1) contains a polyorganosiloxane (a1) having one or more units selected from the group consisting of a siloxane unit represented by $SiO_2$ (unit Q'), a siloxane unit represented by $R^{1'}R^{2'}R^{3'}SiO_{1/2}$ (unit M'), a siloxane unit represented by $R^{4'}R^{5'}SiO_{2/2}$ (unit D'), and a siloxane unit represented by $R^{6'}SiO_{3/2}$ (unit T'), and at least one unit selected from the group consisting of unit M', unit D', and unit T', and a polyorganosiloxane (a2) having one or more units selected from the group consisting of a siloxane unit represented by $SiO_2$ (unit Q''), a siloxane unit represented by $R^{1''}R^{2''}R^{3''}SiO_{1/2}$ (unit M''), a siloxane unit represented by $R^{4''}R^{5''}SiO_{2/2}$ (unit D''), and a siloxane unit represented by $R^{6''}SiO_{3/2}$ (unit T''), and at least one unit selected from the group consisting of unit M'', unit D'', and unit T''.

Each of $R^1$ to $R^6$ is a group or an atom bonded to a silicon atom and represents an alkyl group, an alkenyl group, or a hydrogen atom.

Each of $R^{1'}$ to $R^{6'}$ is a group bonded to a silicon atom and represents an alkyl group or an alkenyl group, and at least one of $R^{1'}$ to $R^{6'}$ is an alkenyl group.

Each of $R^{1''}$ to $R^{6''}$ is a group or an atom bonded to a silicon atom and represents an alkyl group or a hydrogen atom, and at least one of $R^{1''}$ to $R^{6''}$ is a hydrogen atom.

The alkyl group may be linear-chain, branched-chain, or cyclic, but a linear-chain or branched-chain alkyl group is preferred. No particular limitation is imposed on the number of carbon atoms thereof, and the number of carbon atoms is generally 1 to 40, preferably 30 or less, more preferably 20 or less, still more preferably 10 or less.

Specific examples of the linear-chain or branched-chain alkyl group include, but are not limited to, methyl, ethyl, n-propyl, i-propyl, n-butyl, i-butyl, s-butyl, t-butyl, n-pentyl, 1-methyl-n-butyl, 2-methyl-n-butyl, 3-methyl-n-butyl, 1,1-dimethyl-n-propyl, 1,2-dimethyl-n-propyl, 2,2-dimethyl-n-propyl, 1-ethyl-n-propyl, n-hexyl, 1-methyl-n-pentyl, 2-methyl-n-pentyl, 3-methyl-n-pentyl, 4-methyl-n-pentyl, 1,1-dimethyl-n-butyl, 1,2-dimethyl-n-butyl, 1,3-dimethyl-n- butyl, 2,2-dimethyl-n-butyl, 2,3-dimethyl-n-butyl, 3,3-dimethyl-n-butyl, 1-ethyl-n-butyl, 2-ethyl-n-butyl, 1,1,2-trimethyl-n-propyl, 1,2,2-trimethyl-n-propyl, 1-ethyl-1-methyl-n-propyl, and 1-ethyl-2-methyl-n-propyl.

Of these, methyl is preferred.

Specific examples of the cycloalkyl group include, but are not limited to, cycloalkyl groups such as cyclopropyl, cyclobutyl, 1-methyl-cyclopropyl, 2-methyl-cyclopropyl, cyclopentyl, 1-methyl-cyclobutyl, 2-methyl-cyclobutyl, 3-methyl-cyclobutyl, 1,2-dimethyl-cyclopropyl, 2,3-dimethyl-cyclopropyl, 1-ethyl-cyclopropyl, 2-ethyl-cyclopropyl, cyclohexyl, 1-methyl-cyclopentyl, 2-methyl-cyclopentyl, 3-methyl-cyclopentyl, 1-ethyl-cyclobutyl, 2-ethyl-cyclobutyl, 3-ethyl-cyclobutyl, 1,2-dimethyl-cyclobutyl, 1,3-dimethyl-cyclobutyl, 2,2-dimethyl-cyclobutyl, 2,3-dimethyl-cyclobutyl, 2,4-dimethyl-cyclobutyl, 3,3-dimethyl-cyclobutyl, 1-n-propyl-cyclopropyl, 2-n-propyl-cyclopropyl, 1-i-propyl-cyclopropyl, 2-i-propyl-cyclopropyl, 1,2,2-trimethyl-cyclopropyl, 1,2,3-trimethyl-cyclopropyl, 2,2,3-trimethyl-cyclopropyl, 1-ethyl-2-methyl-cyclopropyl, 2-ethyl-1-methyl-cyclopropyl, 2-ethyl-2-methyl-cyclopropyl, and 2-ethyl-3-methyl-cyclopropyl; and bicycloalkyl groups such as bicyclobutyl, bicyclopentyl, bicyclohexyl, bicycloheptyl, bicyclooctyl, bicyclononyl, and bicyclodecyl.

The alkenyl group may be linear-chain or branched-chain. No particular limitation is imposed on the number of carbon atoms thereof, and the number of carbon atoms is generally 2 to 40, preferably 30 or less, more preferably 20 or less, still more preferably 10 or less.

Specific examples of the alkenyl group include, but are not limited to, ethenyl, 1-propenyl, 2-propenyl, 1-methyl ethenyl, 1-butenyl, 2-butenyl, 3-butenyl, 2-methyl propenyl, 2-methyl-2-propenyl, 1-ethylethenyl, 1-methyl propenyl, 1-methyl-2-propenyl, 1-pentenyl, 2-pentenyl, 3-pentenyl, 4-pentenyl, 1-n-propylethenyl, 1-methyl-1-butenyl, 1-methyl-2-butenyl, 1-methyl-3-butenyl, 2-ethyl-2-propenyl, 2-methyl-1-butenyl, 2-methyl-2-butenyl, 2-methyl-3-butenyl, 3-methyl-1-butenyl, 3-methyl-2-butenyl, 3-methyl-3-butenyl, 1,1-dimethyl-2-propenyl, 1-i-propylethenyl, 1,2-dimethyl propenyl, 1,2-dimethyl-2-propenyl, 1-cyclopentenyl, 2-cyclopentenyl, 3-cyclopentenyl, 1-hexenyl, 2-hexenyl, 3-hexenyl, 4-hexenyl, 5-hexenyl, 1-methyl-1-pentenyl, 1-methyl-2-pentenyl, 1-methyl-3-pentenyl, 1-methyl-4-pentenyl, 1-n-butylethenyl, 2-methyl-1-pentenyl, 2-methyl-2-pentenyl, 2-methyl-3-pentenyl, 2-methyl-4-pentenyl, 2-n-propyl-2-propenyl, 3-methyl-1-pentenyl, 3-methyl-2-pentenyl, 3-methyl-3-pentenyl, 3-methyl-4-pentenyl, 3-ethyl-3-butenyl, 4-methyl-1-pentenyl, 4-methyl-2-pentenyl, 4-methyl-3-pentenyl, 4-methyl-4-pentenyl, 1,1-dimethyl-2-butenyl, 1,1-dimethyl-3-butenyl, 1,2-dimethyl-1-butenyl, 1,2-dimethyl-2-butenyl, 1,2-dimethyl-3-butenyl, 1-methyl-2-ethyl-2-propenyl, 1-s-butylethenyl, 1,3-dimethyl-1-butenyl, 1,3-dimethyl-2-butenyl, 1,3-dimethyl-3-butenyl, 1-i-butylethenyl, 2,2-dimethyl-3-butenyl, 2,3-dimethyl-1-butenyl, 2,3-dimethyl-2-butenyl, 2,3-dimethyl-3-butenyl, 2-i-propyl-2-propenyl, 3,3-dimethyl-1-butenyl, 1-ethyl-1-butenyl, 1-ethyl-2-butenyl, 1-ethyl-3-butenyl, 1-n-propyl-1-propenyl, 1-n-propyl-2-propenyl, 2-ethyl-1-butenyl, 2-ethyl-2-butenyl, 2-ethyl-3-butenyl, 1,1,2-trimethyl-2-propenyl, 1-t-butylethenyl, 1-methyl-1-ethyl propenyl, 1-ethyl-2-methyl-1-propenyl, 1-ethyl-2-methyl propenyl, 1-i-propyl-1-propenyl, 1-i-propyl-2-propenyl, 1-methyl-2-cyclopentenyl, 1-methyl-3-cyclopentenyl, 2-methyl-1-cyclopentenyl, 2-methyl-2-cyclopentenyl, 2-methyl cyclopentenyl, 2-methyl-4-cyclopentenyl, 2-methyl cyclopentenyl, 2-methylene-cyclopentyl, 3-methyl-1-cyclopentenyl, 3-methyl-2-cyclopentenyl, 3-methyl cyclopentenyl, 3-methyl-4-cyclopentenyl, 3-methyl-5-cyclopentenyl, 3-methylene-cyclopentyl, 1-cyclohexenyl, 2-cyclohexenyl, and 3-cyclohexenyl.

Of these, ethenyl and 2-propenyl are preferred.

As described above, the polysiloxane (A1) includes the polyorganosiloxane (a1) and the polyorganosiloxane (a2). In curing, the alkenyl group present in the polyorganosiloxane (a1) and the hydrogen atom (Si—H group) present in the polyorganosiloxane (a2) form a cross-linking structure through hydrosilylation in the presence of the platinum group metal catalyst (A2).

The polyorganosiloxane (a1) has one or more units selected from the group consisting of unit Q', unit M', unit D', and unit T', and at least one unit selected from the group consisting of unit M', unit D', and unit T'. Two or more polyorganosiloxanes satisfying the above conditions may be used in combination as the polyorganosiloxane (a1).

Examples of preferred combinations of two or more units selected from the group consisting of unit Q', unit M', unit D', and unit T' include, but are not limited to, (unit Q' and unit M'), (unit D' and unit M'), (unit T' and unit M'), and (unit Q', unit T', and unit M').

In the case where the polyorganosiloxane (a1) includes two or more polyorganosiloxanes, examples of preferred combinations include, but are not limited to, (unit Q' and unit M')+(unit D' and unit M'); (unit T' and unit M')+(unit D' and unit M'); and (unit Q', unit T', and unit M')+(unit T' and unit M').

The polyorganosiloxane (a2) has one or more units selected from the group consisting of unit Q'', unit M'', unit D'', and unit T'', and at least one unit selected from the group consisting of unit M'', unit D'', and unit T''. Two or more polyorganosiloxanes satisfying the above conditions may be used in combination as the polyorganosiloxane (a2).

Examples of preferred combinations of two or more units selected from the group consisting of unit Q'', unit M'', unit D'', and unit T'' include, but are not limited to, (unit M'' and unit D''), (unit Q'' and unit M''), and (unit Q'', unit T'', and unit M'').

The polyorganosiloxane (a1) is formed of siloxane units in which an alkyl group and/or an alkenyl group is bonded to a silicon atom. The alkenyl group content of the entire substituents $R^{1'}$ to $R^{6'}$ is preferably 0.1 mol % to 50.0 mol %, more preferably 0.5 mol % to 30.0 mol %, and the remaining $R^{1'}$ to $R^{6'}$ may be alkyl groups.

The polyorganosiloxane (a2) is formed of siloxane units in which an alkyl group and/or a hydrogen atom is bonded to a silicon atom. The hydrogen atom content of the entire substituents or atoms $R^{1''}$ to $R^{6''}$ is preferably 0.1 mol % to 50.0 mol %, more preferably 10.0 mol % to 40.0 mol %, and the remaining $R^{1''}$ to $R^{6''}$ may be alkyl groups.

The polysiloxane (A1) includes the polyorganosiloxane (a1) and the polyorganosiloxane (a2). In a preferred embodiment, the ratio by mole of alkenyl groups present in the polyorganosiloxane (a1) to hydrogen atoms forming Si—H bonds present in the polyorganosiloxane (a2) is 1.0:0.5 to 1.0:0.66.

The weight average molecular weight of each of the polyorganosiloxane (a1) and the polyorganosiloxane (a2) is generally 500 to 1,000,000. From the viewpoint of attaining the effects of the present invention at high reproducibility, the weight average molecular weight is preferably 5,000 to 50,000.

Meanwhile, in the present invention, the weight average molecular weight, number average molecular weight, and polydispersity may be determined by means of, for example, a GPC apparatus (EcoSEC, HLC-8320GPC, products of Tosoh Corporation) and GPC columns (TSKgel SuperMultiporeHZ-N and TSKgel SuperMultiporeHZ-H, products of Tosoh Corporation) at a column temperature of 40° C. and a flow rate of 0.35 mL/min by use of tetrahydrofuran as an eluent (extraction solvent) and polystyrene (product of Sigma-Aldrich) as a standard substance.

The viscosity of each of the polyorganosiloxane (a1) and the polyorganosiloxane (a2) is generally 10 to 1,000,000 (mPs). From the viewpoint of attaining the effects of the present invention at high reproducibility, the viscosity is preferably 50 to 10,000 (mPs). Notably, in the present invention, the viscosity is measured at 25° C. by means of an E-type rotational viscometer.

The polyorganosiloxane (a1) and the polyorganosiloxane (a2) react with each other via hydrosilylation, to thereby form a film. Thus, the curing mechanism differs from the mechanism of curing mediated by, for example, silanol groups. Therefore, neither of the siloxanes is required to have a silanol group or a functional group forming a silanol group through hydrolysis (e.g., an alkyloxy group).

In a preferred embodiment, the adhesive component (S) contains the aforementioned polysiloxane (A1) and the platinum group metal catalyst (A2).

The platinum-based metallic catalyst is used to accelerate hydrosilylation between alkenyl groups of the polyorganosiloxane (a1) and Si—H groups of the polyorganosiloxane (a2).

Specific examples of the platinum-based metallic catalyst include, but are not limited to, platinum catalysts such as platinum black, platinum(II) chloride, chloroplatinic acid, a reaction product of chloroplatinic acid and a monohydric alcohol, a chloroplatinic acid-olefin complex, and platinum bis(acetoacetate).

Examples of the platinum-olefin complex include, but are not limited to, a complex of platinum with divinyltetramethyldisiloxane.

The amount of platinum group metal catalyst (A2) is generally 1.0 to 50.0 ppm, with respect to the total amount of polyorganosiloxane (a1) and polyorganosiloxane (a2).

In order to suppress progress of hydrosilylation, the polyorganosiloxane component (A) may contain a polymerization inhibitor (A3).

No particular limitation is imposed on the polymerization inhibitor, so long as it can suppress the progress of hydrosilylation. Specific examples of the polymerization inhibitor include alkynyl alcohols such as 1-ethynyl-1-cyclohexanol and 1,1-diphenyl-2-propyn-1-ol.

Generally, the amount of polymerization inhibitor with respect to the total amount of the polyorganosiloxane (a1) and the polyorganosiloxane (a2) is 1,000.0 ppm or more from the viewpoint of attaining the effect, and 10,000.0 ppm or less from the viewpoint of preventing excessive suppression of hydrosilylation.

The adhesive composition used in the present invention may contain a releasing agent component (B). Through incorporation of the releasing agent component (B) into the adhesive composition used in the present invention, the formed adhesive layer can be suitably peeled at high reproducibility.

A typical example of the releasing agent component (B) is a polyorganosiloxane. Specific examples of the polyorganosiloxane include, but are not limited to, an epoxy-group-containing polyorganosiloxane, a methyl-group-containing polyorganosiloxane, and a phenyl-group-containing polyorganosiloxane.

The weight average molecular weight of the polyorganosiloxane serving as the releasing agent component (B) is generally 100,000 to 2,000,000. However, the weight average molecular weight is preferably 200,000 to 1,200,000, more preferably 300,000 to 900,000, from the viewpoint of attaining the effects of the present invention at high reproducibility. The polyorganosiloxane generally has a dispersity of 1.0 to 10.0. However, the dispersity is preferably 1.5 to 5.0, more preferably 2.0 to 3.0, from the viewpoint of attaining the effects of the present invention at high reproducibility. The weight average molecular weight and the dispersity may be measured through the methods as described above.

The epoxy-group-containing polyorganosiloxane includes such a siloxane containing a siloxane unit represented by, for example, $R^{11}R^{12}SiO_{2/2}$(unit $D^{10}$).

$R^{11}$ is a group bonded to a silicon atom and represents an alkyl group, and $R^{12}$ is a group bonded to a silicon atom and represents an epoxy group or an organic group containing an epoxy group. Specific examples of the alkyl group include those as exemplified above.

The epoxy group in the organic group containing an epoxy group may be an independent epoxy group which does not condense with another ring structure, or may be an epoxy group forming a condensed ring with another ring structure (e.g., a 1,2-epoxycyclohexyl group).

Specific examples of the organic group containing an epoxy group include, but are not limited to, 3-glycidoxypropyl and 2-(3,4-epoxycyclohexyl)ethyl.

In the present invention, examples of preferred epoxy-group-containing polyorganosiloxanes include, but are not limited to, an epoxy-group-containing polydimethylsiloxane.

The epoxy-group-containing polyorganosiloxane contains the aforementioned siloxane unit (unit $D^{10}$), but may also contain the aforementioned unit Q, unit M and/or unit T, in addition to unit $D^{10}$.

In a preferred embodiment, specific examples of the epoxy-group-containing polyorganosiloxane include polyorganosiloxane formed only of unit $D^{10}$, polyorganosiloxane formed of unit $D^{10}$ and unit Q, polyorganosiloxane formed of unit $D^{10}$ and unit M, polyorganosiloxane formed of unit $D^{10}$ and unit T, polyorganosiloxane formed of unit $D^{10}$, unit Q, and unit M, polyorganosiloxane formed of unit $D^{10}$, unit M, and unit T, and polyorganosiloxane formed of unit $D^{10}$, unit Q, unit M, and unit T.

The epoxy-group-containing polyorganosiloxane is preferably an epoxy-group-containing polydimethylsiloxane having an epoxy value of 0.1 to 5. The weight average molecular weight thereof is generally 1,500 to 500,000, but preferably 100,000 or lower, for the purpose of suppression of precipitation in the adhesive composition.

Specific examples of the epoxy-group-containing polyorganosiloxane include, but are not limited to, CMS-227 (product of Gelest Inc., weight average molecular weight: 27,000) represented by formula (A-1), ECMS-327 (product of Gelest Inc., weight average molecular weight: 28,800) represented by formula (A-2), KF-101 (product of Shin-Etsu Chemical Co., Ltd., weight average molecular weight: 31,800) represented by formula (A-3), KF-1001 (product of Shin-Etsu Chemical Co., Ltd., weight average molecular weight: 55,600) represented by formula (A-4), KF-1005 (product of Shin-Etsu Chemical Co., Ltd., weight average molecular weight: 11,500) represented by formula (A-5), X-22-343 (product of Shin-Etsu Chemical Co., Ltd., weight average molecular weight: 2,400) represented by formula (A-6), BY16-839 (product of Dow Corning, weight average molecular weight: 51,700) represented by formula (A-7), and ECMS-327 (product of Gelest Inc., weight average molecular weight: 28,800) represented by formula (A-8).

[F5]

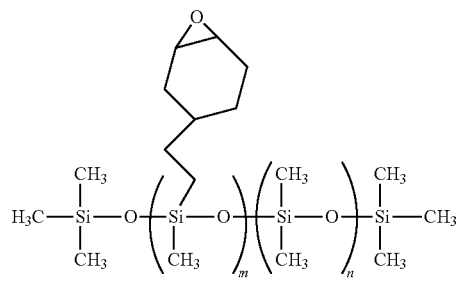

(A-1)

(Each of m and n represents the number of repeating units.)

[F6]

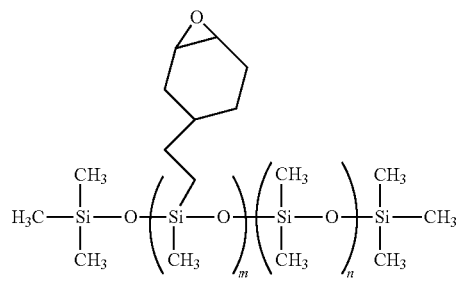

(A-2)

(Each of m and n represents the number of repeating units.)

[F7]

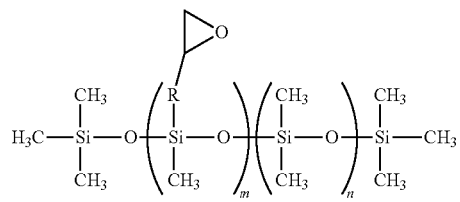

(A-3)

(Each of m and n represents the number of repeating units. R represents a C1 to C10 alkylene group.)

[F8]

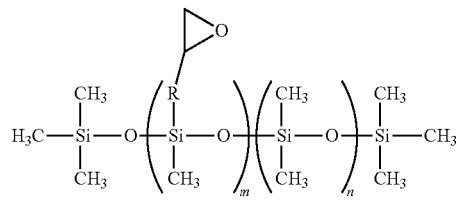

(A-4)

(Each of m and n represents the number of repeating units. R represents a C1 to C10 alkylene group.)

[F9]

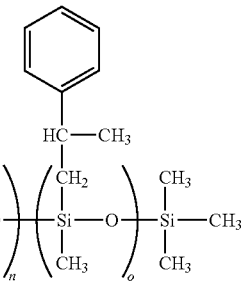

(A-5)

(Each of m, n and o represents the number of repeating units. R represents a C1 to C10 alkylene group.)

[F10]

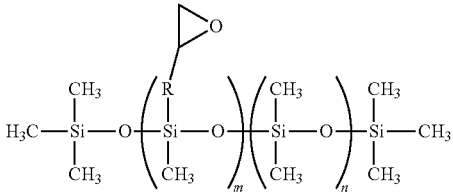

(A-6)

(Each of m and n represents the number of repeating units. R represents a C1 to C10 alkylene group.)

[F11]

(A-7)

(Each of m and n represents the number of repeating units. R represents a C1 to C10 alkylene group.)

[F12]

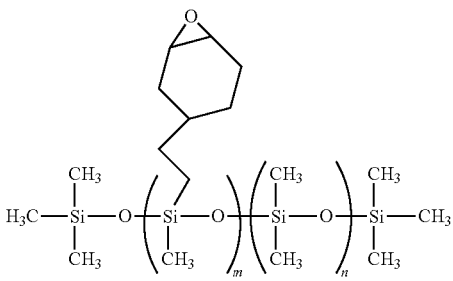

(A-8)

(Each of m and n represents the number of repeating units.)

The methyl-group-containing polyorganosiloxane includes, for example, a siloxane containing a siloxane unit represented by $R^{210}R^{220}SiO_{2/2}$ (unit $D^{200}$), preferably a siloxane containing a siloxane unit represented by $R^{21}R^{21}SiO_{2/2}$ (unit $D^{20}$).

Each of $R^{210}$ and $R^{220}$ is a group bonded to a silicon atom and represents an alkyl group. At least one of $R^{210}$ and $R^{220}$ is a methyl group. Specific examples of the alkyl group include those as exemplified above.

$R^{21}$ is a group bonded to a silicon atom and represents an alkyl group. Specific examples of the alkyl group include those as exemplified above. $R^{21}$ is preferably a methyl group.

Examples of preferred methyl-group-containing polyorganosiloxanes include, but are not limited to, polydimethylsiloxane.

The methyl-group-containing polyorganosiloxane contains the aforementioned siloxane unit (unit $D^{200}$ or unit $D^{20}$), but may also contain the aforementioned unit Q, unit M and/or unit T, in addition to unit $D^{200}$ or unit $D^{20}$.

In an embodiment, specific examples of the methyl-group-containing polyorganosiloxane include polyorganosiloxane formed only of unit $D^{200}$, polyorganosiloxane formed of unit $D^{200}$ and unit Q, polyorganosiloxane formed of unit $D^{200}$ and unit M, polyorganosiloxane formed of unit $D^{200}$ and unit T, polyorganosiloxane formed of unit $D^{200}$, unit Q, and unit M, polyorganosiloxane formed of unit $D^{200}$, unit M, and unit T, and polyorganosiloxane formed of unit $D^{200}$, unit Q, unit M, and unit T.

In a preferred embodiment, specific examples of the methyl-group-containing polyorganosiloxane include polyorganosiloxane formed only of unit $D^{20}$, polyorganosiloxane formed of unit $D^{20}$ and unit Q, polyorganosiloxane formed of unit $D^{20}$ and unit M, polyorganosiloxane formed of unit $D^{20}$ and unit T, polyorganosiloxane formed of unit $D^{20}$, unit Q, and unit M, polyorganosiloxane formed of unit $D^{20}$, unit M, and unit T, and polyorganosiloxane formed of unit $D^{20}$, unit Q, unit M, and unit T.

The viscosity of the methyl-group-containing polyorganosiloxane is generally 1,000 to 2,000,000 mm$^2$/s, preferably 10,000 to 1,000,000 mm$^2$/s. The methyl-group-containing polyorganosiloxane is typically dimethylsilicone oil formed of polydimethylsiloxane. The value of the viscosity is a kinematic viscosity (cSt (=mm$^2$/s)). The kinematic viscosity may be measured by means of a kinematic viscometer. Alternatively, the kinematic viscosity may also be calculated by dividing viscosity (mPas) by density (g/cm$^3$). In other words, the kinematic viscosity may be determined from a viscosity as measured at 25° C. by means of an E-type rotational viscometer and a density. The calculation formula is kinematic viscosity (mm$^2$/s)=viscosity (mPas)/density (g/cm$^3$).

Specific examples of the methyl-group-containing polyorganosiloxane include, but are not limited to, WACKER-SILICONE FLUID AK series (products of WACKER) and dimethylsilicone oils (KF-96L, KF-96A, KF-96, KF-96H, KF-69, KF-965, and KF-968) and cyclic dimethylsilicone oil (KF-995) (products of Shin-Etsu Chemical Co., Ltd.).

Examples of the phenyl-group-containing polyorganosiloxane include a siloxane containing a siloxane unit represented by $R^{31}R^{32}SiO_{2/2}$ (unit $D^{30}$).

$R^{31}$ is a group bonded to a silicon atom and represents a phenyl group or an alkyl group, and $R^{32}$ is a group bonded to a silicon atom and represents a phenyl group. Specific examples of the alkyl group include those as exemplified above. $R^{31}$ is preferably a methyl group.

The phenyl-group-containing polyorganosiloxane contains the aforementioned siloxane unit (unit $D^{30}$), but may also contain the aforementioned unit Q, unit M and/or unit T, in addition to unit $D^{30}$.

In a preferred embodiment, specific examples of the phenyl-group-containing polyorganosiloxane include polyorganosiloxane formed only of unit $D^{30}$, polyorganosiloxane formed of unit $D^{30}$ and unit Q, polyorganosiloxane formed of unit $D^{30}$ and unit M, polyorganosiloxane formed of unit $D^{30}$ and unit T, polyorganosiloxane formed of unit $D^{30}$, unit Q, and unit M, polyorganosiloxane formed of unit $D^{30}$, unit M, and unit T, and polyorganosiloxane formed of unit $D^{30}$, unit Q, unit M, and unit T.

The weight average molecular weight of the phenyl-group-containing polyorganosiloxane is generally 1,500 to 500,000, but preferably 100,000 or lower, for the purpose of suppression of deposition in the adhesive composition and for other reasons.

Specific examples of the phenyl-group-containing polyorganosiloxane include, but are not limited to, PMM-1043 (product of Gelest Inc., weight average molecular weight: 67,000, viscosity: 30,000 mm$^2$/s) represented by formula (C-1), PMM-1025 (product of Gelest Inc., weight average molecular weight: 25,200, viscosity: 500 mm$^2$/s) represented by formula (C-2), KF50-3000CS (product of Shin-Etsu Chemical Co., Ltd., weight average molecular weight: 39,400, viscosity: 3,000 mm$^2$/s) represented by formula (C-3), TSF431 (product of MOMENTIVE, weight average molecular weight: 1,800, viscosity: 100 mm$^2$/s) represented by formula (C-4), TSF433 (product of MOMENTIVE, weight average molecular weight: 3,000, viscosity: 450 mm$^2$/s) represented by formula (C-5), PDM-0421 (product of Gelest Inc., weight average molecular weight: 6,200, viscosity: 100 mm$^2$/s) represented by formula (C-6), and PDM-0821 (product of Gelest Inc., weight average molecular weight: 8,600, viscosity: 125 mm$^2$/s) represented by formula (C-7).

[F13]

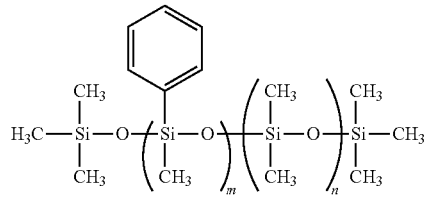

(C-1)

(Each of m and n represents the number of repeating units.)

[F14]

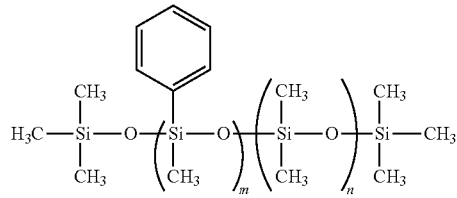

(C-2)

(Each of m and n represents the number of repeating units.)

[F15]

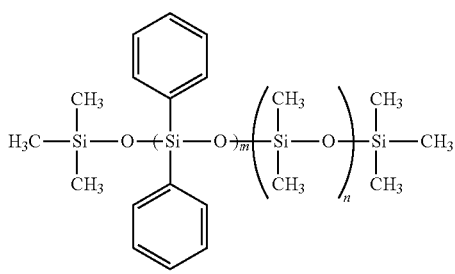

(C-3)

(Each of m and n represents the number of repeating units.)

[F16]

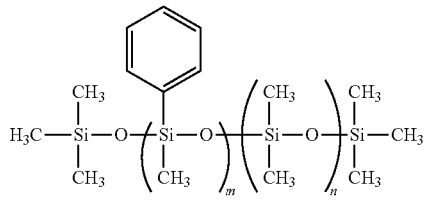

(C-4)

(Each of m and n represents the number of repeating units.)

[F17]

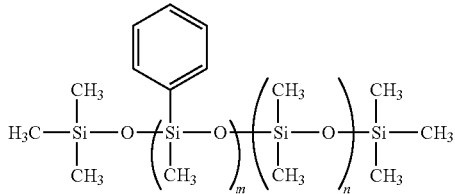

(C-5)

(Each of m and n represents the number of repeating units.)

[F18]

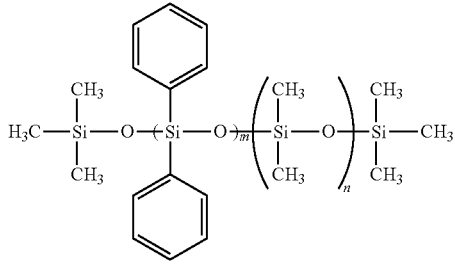

(C-6)

(Each of m and n represents the number of repeating units.)

[F19]

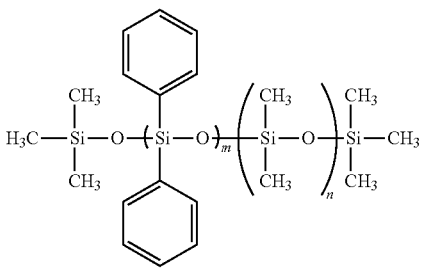

(C-7)

(Each of m and n represents the number of repeating units.)

In a preferred embodiment, the adhesive composition used in the present invention may contain the polyorganosiloxane component (A) which is curable through hydrosilylation, and the releasing agent component (B). In a more preferred embodiment, the releasing agent component (B) contains a polyorganosiloxane.

The adhesive composition used in the present invention contains the adhesive component (S) and the releasing agent component (B) at any compositional ratio. In consideration of the balance between bonding performance and release performance, the compositional ratio (by mass) of component (S) to component (B) is preferably 99.995:0.005 to 30:70, more preferably 99.9:0.1 to 75:25.

In other words, when the adhesive composition contains the polyorganosiloxane component (A) which is curable through hydrosilylation, the compositional ratio (by mass) of component (A) to component (B) is preferably 99.995:0.005 to 30:70, more preferably 99.9:0.1 to 75:25.

For the purpose of adjusting the viscosity or for other reasons, the adhesive composition used in the present invention may contain a solvent. Specific examples of the solvent include, but are not limited to, an aliphatic hydrocarbon, an aromatic hydrocarbon, and a ketone.

More specific examples of the solvent include, but are not limited to, hexane, heptane, octane, nonane, decane, undecane, dodecane, isododecane, menthane, limonene, toluene, xylene, mesitylene, cumene, MIBK (methyl isobutyl ketone), butyl acetate, diisobutyl ketone, 2-octanone, 2-nonanone, and 5-nonanone. These solvents may be used singly or in combination of two or more species.

In the case where the adhesive composition used in the present invention contains a solvent, the solvent content is appropriately adjusted in consideration of a target viscosity of the adhesive composition, the application method to be employed, the thickness of the formed thin film, etc. The solvent content of the entire composition is about 10 to about 90 mass %.

The adhesive composition used in the present invention generally has a viscosity (25° C.) of 500 to 20,000 mPas, preferably 1,000 to 5,000 mPas. The viscosity may be controlled by modifying the type and formulation of the organic solvent used, the film-forming component concentration, etc., in consideration of various factors such as the coating method employed and the target film thickness.

In the present invention, the term "film-forming component" used in the present invention refers to any component other than solvent, which component is contained in the composition.

The adhesive composition used in the present invention may be produced by mixing the adhesive component (S) with the releasing agent component (B) and a solvent, which are optional ingredients of the composition.

No particular limitation is imposed on the sequential order of mixing, so long as the adhesive composition of the present invention can be easily produced at high reproducibility. Thus, no particular limitation is imposed on the adhesive composition production method. One possible example of the production method includes dissolving the adhesive component (S) and the releasing agent composition (B) in a solvent. Another possible example of the production method includes dissolving a part of the adhesive component (S) and the releasing agent composition (B) in a solvent, dissolving the remaining part in another solvent, and mixing the two thus-obtained solutions. Notably, so long as the relevant components are not decomposed or denatured in preparation of the adhesive composition, the mixture may be appropriately heated.

In the present invention, in order to remove foreign substances present in the adhesive composition, the composition may be filtered through a sub-micrometer filter or the like in the course of production of the adhesive composition or after mixing all the components.

As described above, the semiconductor substrate cleaning method of the present invention includes a step of removing an adhesive layer provided on a semiconductor substrate by use of a remover composition, wherein the remover composition contains a solvent but no salt, and the solvent includes an organic solvent represented by formula (L) in an amount of 80 mass % or more.

The organic solvent represented by formula (L) may be composed of a single species or in combination of two or more species.

In the aforementioned formula (L), L represents a substituent to the benzene ring, and each of a plurality of Ls represents a C1 to C4 alkyl group. The parameter k represents the number of Ls and is an integer of 0 to 5.

The alkyl group may be linear-chain, branched-chain, or cyclic. The alkyl group is preferably a linear-chain or branched-chain alkyl group.

Specific examples of the linear-chain or branched chain alkyl group include, but are not limited to, methyl, ethyl, n-propyl, i-propyl, n-butyl, i-butyl, s-butyl, and t-butyl.

Specific examples of the cycloalkyl group include, but are not limited to, cyclopropyl, cyclobutyl, 1-methyl-cyclopropyl, 2-methyl-cyclopropyl, and cyclopentyl.

From the viewpoint of realizing removal of the adhesive layer at high reproducibility for a shorter time, availability of material compounds, and the like, L is preferably a methyl group or an isopropyl group.

From the viewpoints of realizing removal of the adhesive layer at high reproducibility for a shorter time, availability of material compounds, and the like, k is preferably 4 or less, more preferably 3 or less, still more preferably 2 or less.

From the viewpoints of realizing removal of the adhesive layer at high reproducibility for a shorter time, availability of material compounds, and the like, examples of preferred organic solvents represented by formula (L) include toluene, mesitylene, p-cymene, and 1,2,4-trimethylbenzene.

The remover composition used in the present invention contains no salt.

Specific examples of the salt include those employed for the same use, and typical examples include ammonium salts such as tetrabutylammonium hydroxide and tetrabutylammonium fluoride, which are added to the composition for promoting removal of the adhesive layer and the residue of the layer, and other reasons.

The remover composition of the present invention contains an organic solvent represented by formula (L), and no such salt is required as a component.

Since such salt may cause damage (e.g., corrosion) on a substrate, particularly a substrate having bumps or the like, a salt-free remover composition is used in the present invention. However, in the case where the bulk solvent serving as an ingredient of the remover composition originally contains a small amount of a salt as an impurity, the presence of the salt is not excluded.

In the solvent contained in the remover composition of the present invention, the amount of the organic solvent represented by formula (L) is 80 mass % or more, preferably 85 mass % or more, more preferably 87 mass % or more, still more preferably 89 mass % or more. As a result of adjusting the amount of the organic solvent represented by formula (L) to fall within the aforementioned range(s), the adhesive layer can be removed in a short period of time. However, when the organic solvent content falls outside the above range(s), the time for peeling (removal) is considerably prolonged, which is not preferred.

Most preferably, the solvent contained in the remover composition is formed of an organic solvent represented by formula (L).

In this case, ideally, the solvent contained in the remover composition is completely formed of an organic solvent represented by formula (L) and contains no other solvent as an impurity. However, in practice, there exists a certain limit of purification degree, and complete purification is technically impossible.

Therefore, in the present invention, the solvent contained in the remover composition is formed only of an organic solvent represented by formula (L), which is intentionally used as a solvent. There is not excluded the unavoidable presence of water and impurities (e.g., other organic solvents), which cannot easily be removed due to similarity in structure or property in the bulk organic solvent represented by formula (L).

Under such circumstances, when the solvent contained in the remover composition is formed of an organic solvent represented by formula (L), the organic solvent (L) content of the solvent of the remover composition may be less than 100% in some cases, wherein the content is a purity value determined through gas chromatography. The organic solvent (L) content is generally 94% or more, preferably 95% or more, more preferably 96% or more, still more preferably 97% or more, yet more preferably 98% or more, further more preferably 99% or more.

In the present invention, the adhesive layer on the semiconductor substrate is separated from the semiconductor substrate by continuously bringing the adhesive layer into contact with the remover composition, to thereby cause swelling of the adhesive layer.

No particular limitation is imposed on the method of continuously bringing the adhesive layer on the semiconductor substrate into contact with the remover composition, so long as the adhesive layer on the semiconductor substrate is in contact with the remover composition continuously over a specific period of time. This temporal continuity includes a case where the adhesive layer is continuously in contact with the remover composition; a case where, for example, contact between the adhesive layer and the organic solvent is maintained for a specific period of time, once stopped, and then resumed; and a case where such a sequence is repeated. Also, the entirety of the adhesive layer on the semiconductor substrate may be in contact with the remover composition, or a part of the adhesive layer may be in contact with the remover composition. From the viewpoint of performing effective cleaning at high reproducibility, preferable modes include a mode in which the adhesive layer on the semiconductor substrate is continuously in contact with the remover composition, and a mode in which the entirety of the adhesive layer is in contact with the remover composition.

Thus, in a preferred embodiment of the present invention, the adhesive layer on the semiconductor substrate is swelled by immersing the adhesive layer in the remover composition, to thereby separate the layer from the semiconductor substrate. Alternatively, the adhesive layer on the semiconductor substrate is swelled by continuously feeding the remover composition onto the adhesive layer, to thereby separate the layer from the semiconductor substrate.

In one mode of immersing in the remover composition the adhesive layer on the semiconductor substrate, a semiconductor substrate provided with the adhesive layer is immersed in the remover composition.

No particular limitation is imposed on the time of immersion, so long as swelling of the adhesive layer occurs, to thereby separate the adhesive layer from the semiconductor substrate. However, the immersion time is 5 seconds or longer, from the viewpoint of performing effective cleaning at high reproducibility, and 5 minutes or shorter, from the viewpoint of process throughput.

When the adhesive layer on the semiconductor substrate is immersed in the remover composition, separation of the adhesive layer may be promoted by actively moving the semiconductor substrate provided with the adhesive layer in the remover composition, causing convection of the remover composition, providing vibration to the remover composition through ultrasonication, or a similar technique.

For actively moving the semiconductor substrate provided with the adhesive layer in the remover composition, a cleaning apparatus such as a shaking cleaner or a paddle cleaner may be employed. By use of such a cleaning apparatus, a support sustaining thereon the semiconductor substrate provided with the adhesive layer is moved up and down or left and right, or in a rotational manner, whereby the adhesive layer on the semiconductor substrate relatively receives convection, or convection generated through the active movement or rotation. As a result, swelling of the adhesive layer on the semiconductor substrate and separation of the adhesive layer from the semiconductor substrate are promoted.

For causing convection of the remover composition, the aforementioned shaking cleaner or paddle cleaner, and a convection cleaner may be employed. A typical example of the convection cleaner is such a cleaning apparatus as having a convection means and realizing a convection state of the remover composition surrounding the semiconductor substrate having the adhesive layer which is fixed to a stage or the like.

For providing ultrasonic vibration to the remover composition, an ultrasonic cleaning apparatus or an ultrasonic probe may be used for generating vibration at a frequency of generally 20 kHz to 5 MHz.

In one mode of continuously feeding the remover composition onto the adhesive layer on the semiconductor substrate, a jet of the remover composition is continuously applied to the adhesive layer on the semiconductor substrate. In one specific mode thereof, when the adhesive layer on the semiconductor substrate faces upward, a straight stream or a mist (preferably a straight stream) of the remover composition is continuously fed to the adhesive layer from the upper (or diagonally upper) direction by means of a nozzle or the like of the cleaning apparatus. In this case, the temporal continuity also includes a case where the remover composition is continuously fed to the adhesive layer on the semiconductor substrate; a case where, for example, feeding of the remover composition is maintained for a specific period of time, once stopped, and then resumed; and a case where such a sequence is repeated. From the viewpoint of performing effective cleaning at high reproducibility, preferably, the remover composition is continuously fed to the surface of the adhesive layer on the semiconductor substrate.

When a straight stream of the remover composition is fed to the adhesive layer on the semiconductor substrate, the flow rate of the composition is generally 200 to 500 mL/min.

In an embodiment of the present invention, for securing a continuous contact state of the remover composition, the adhesive layer on the semiconductor substrate is brought into contact with a vapor of the remover composition by means of, for example, a steam cleaner.

The semiconductor substrate cleaning method of the present invention may include a step of discarding the separated adhesive layer.

No particular limitation is imposed on the method of discarding the separated adhesive layer, so long as the adhesive layer removed from the semiconductor substrate is taken way. In the case where a semiconductor substrate having an adhesive layer is immersed in the remover composition, the separated adhesive layer may be picked up without removing the semiconductor substrate from the remover composition. Alternatively, the semiconductor substrate is removed from the remover composition, and the separated adhesive layer is discarded. In this case, when the semiconductor substrate is simply removed from the remover composition, the separated adhesive layer occasionally remains in the remover composition, whereby the greater part of the adhesive layer can be discarded.

No particular limitation is imposed on the method of discarding the separated adhesive layer. Specific examples of the discarding method include, but are not limited to, absorption or suction by means of an apparatus, gas blowing by means of an air gun or the like, moving the semiconductor substrate up and down or left and right, and centrifugal force by moving in a rotational manner.

After discarding the separated adhesive layer, if required, drying and other treatments of the semiconductor substrate are conducted through a customary method.

The remover composition used in the semiconductor substrate cleaning method of the present invention is also a subject matter of the present invention. The remover composition of the present invention is used for separating, from the semiconductor substrate, the adhesive layer provided on the semiconductor substrate. Preferred embodiments and conditions of use of the composition are as described above. The remover composition of the present invention may be produced by mixing a solvent forming the composition in any timing, if required. In this case, the composition may be subjected to filtration and the like, if needed.

Through employment of the semiconductor substrate cleaning method of the present invention described above, an adhesive layer (in particular, a cured film formed from a siloxane adhesive containing a polyorganosiloxane component (A) which is curable through hydrosilylation) on a semiconductor substrate can be efficiently and easily removed from the semiconductor substrate (in particular, a semiconductor substrate having bumps), while damage to bumps provided on the semiconductor substrate is reduced. Thus, high-efficiency production of favorable semiconductor elements is expected.

Examples of the semiconductor substrate to be cleaned through the cleaning method of the present invention include a silicon semiconductor substrate (e.g., the aforementioned silicon wafer), a germanium substrate, a gallium arsenide substrate, a gallium phosphide substrate, a gallium aluminum arsenide substrate, an aluminum-plated silicon substrate, a copper-plated silicon substrate, a silver-plated silicon substrate, a gold-plated silicon substrate, a titanium-plated silicon substrate, a silicon nitride film-coated silicon substrate, a silicon oxide film-coated silicon substrate, a polyimide film-coated silicon substrate, a glass substrate, a quartz substrate, a liquid crystal substrate, and an organic EL substrate.

In the field of semiconductor processing, the semiconductor substrate to be cleaned through the semiconductor substrate cleaning method of the present invention is employed in, for example, a method of producing a processed (e.g., thinned) semiconductor substrate for use in semiconductor packaging such as TSV.

Specifically, the semiconductor substrate cleaning method of the present invention is employed in the following processed (e.g., thinned) semiconductor substrate production method comprising: a first step of producing a laminate having a semiconductor substrate, a support substrate, and an adhesive layer formed from an adhesive composition; a second step of processing the semiconductor substrate of the produced laminate; a third step of separating the processed semiconductor substrate and the adhesive layer from the support substrate; and a fourth step of removing the adhesive layer from the processed semiconductor substrate and cleaning the processed semiconductor substrate. The cleaning method of the present invention is employed in the above fourth step.

The adhesive composition used in the first step for forming an adhesive layer may be selected from the aforementioned various adhesives. The semiconductor substrate cleaning method of the present invention is effective for removing an adhesive layer formed from a polysiloxane adhesive and more effective for removing an adhesive layer formed from a polysiloxane adhesive containing component (A) which is curable through hydrosilylation.

Thus, next will be described an example of removing an adhesive layer through the cleaning method of the present invention in production of a processed semiconductor substrate through employment of the adhesive layer formed from a polysiloxane adhesive (adhesive composition). However, the above example should not be construed as limiting the present invention thereto.

Firstly, the first step will be described. In the first step, a laminate which has a semiconductor substrate, a support substrate, and an adhesive layer formed from an adhesive composition is produced.

In one embodiment, the first step includes applying an adhesive composition onto the semiconductor substrate or the support substrate, to thereby form an adhesive coating layer, and adhering the semiconductor substrate to the support substrate by the mediation of the adhesive coating layer; applying a load to the semiconductor substrate and the support substrate in a thickness direction, to thereby closely bind the two substrates, while at least one of a heat treatment and a reduced pressure treatment is performed; and then performing a post-heat treatment, to thereby yield a laminate.

In another embodiment, the first step includes applying an adhesive composition to, for example, a circuit-side surface of a wafer serving as the semiconductor substrate and heating the adhesive composition, to thereby form an adhesive coating layer; applying a releasing agent composition to a surface of the support substrate and heating the releasing agent composition, to thereby form a releasing agent coating layer; closely binding the adhesive coating layer of the semiconductor substrate to the releasing agent coating layer of the support substrate by applying a load to the semiconductor substrate and the support substrate in a thickness direction, while at least one of a heat treatment and a reduced pressure treatment is performed; and then performing a post-heat treatment, to thereby yield a laminate. In the above case, the adhesive composition is applied to the semiconductor substrate, and the releasing agent composition is applied to the support substrate, followed by heating. However, alternatively, the adhesive composition and the releasing agent composition may be sequentially applied to any of the substrates, followed by heating.

In the above embodiments, employment of the heat treatment, a reduced pressure treatment, or a combination thereof is determined in consideration of various conditions such as the type of the adhesive composition, the specific compositional ratio of the releasing agent composition, compatibility of the films formed from these compositions, film thickness, and target adhesion strength.

In one embodiment, the semiconductor substrate is a wafer, and the support substrate is a support. The adhesive composition may be applied to either of the semiconductor substrate and the support substrate, or to both of the semiconductor substrate and the support substrate.

No particular limitation is imposed on the wafer. Examples of the wafer include, but are not limited to, a silicon wafer or a glass wafer having a diameter of about 300 mm and a thickness of about 770 µm.

Particularly, the semiconductor substrate cleaning method of the present invention achieves effective cleaning of a semiconductor substrate having bumps, while damage to the bumps is suppressed.

Examples of the semiconductor substrate having bumps include a silicon wafer having bumps (e.g., ball bumps, printed bumps, stud bumps, and plating bumps). Generally, such bumps are provided under conditions appropriately selected from a bump height of about 1 µm to about 200 µm, a bump diameter of 1 µm to 200 µm, and a bump pitch of 1 µm to 500 µm.

Specific examples of the plating bump include, but are not limited to, an Sn-base alloy plating bump such as an Sn—Ag bump, an Sn—Bi bump, an Sn bump, or an Au—Sn bump.

No particular limitation is imposed on the support (carrier). Examples of the support include, but are not limited to, a silicon wafer having a diameter of about 300 mm and a thickness of about µm.

Examples of the releasing agent composition include compositions which contain a releasing agent component used in the technical field.

No particular limitation is imposed on the coating method, and the spin coating technique is generally employed. In an alternative method, a coating film is formed through spin coating or the like, and the thus-formed coating film sheet is adhered. Such methods or products are also called coating or coating films.

The temperature of heating the coated adhesive composition cannot be determined unequivocally, since it varies depending on the type and amount of adhesive component of the adhesive composition, presence of solvent, the target thickness of the adhesive layer, etc. However, the heating temperature is generally 80 to 150° C., and the heating time is generally 30 seconds to 5 minutes.

The temperature of heating the coated releasing agent composition cannot be determined unequivocally, since it varies depending on the types and amounts of the cross-linking agent, acid-generator, acid, and the like, presence of solvent, the target thickness of the release layer, etc. However, the heating temperature is 120° C. or higher from the viewpoint of attaining suitable curing, and 260° C. or lower from the viewpoint of prevention of excessive curing. The heating time is generally 1 to 10 minutes.

Heating may be performed by means of a hot plate, an oven, or the like.

The thickness of the adhesive coating layer formed by applying the adhesive composition and heating is generally 5 to 500 μm.

The thickness of the releasing agent coating layer formed by applying the releasing agent composition and heating is generally 5 to 500 μm.

The heat treatment is generally performed at a temperature appropriately selected from a range of 20 to 150° C., in consideration of softening the adhesive coating layer to achieve suitable bonding with the releasing agent coating layer, suitable curing of the releasing agent coating layer, and other factors. Particularly, the heating temperature is preferably 130° C. or lower, more preferably 90° C. or lower, from the viewpoint of suppressing and avoiding excessive curing and undesired deterioration of the adhesive component and the releasing agent component. The time of heating is generally 30 seconds or longer, preferably 1 minute or longer, for securing temporary bonding performance and release performance. Also, the heating time is generally 10 minutes or shorter, preferably 5 minutes or shorter, from the viewpoint of suppressing deterioration of the adhesive layer and other members.

In the reduced pressure treatment, a set of the semiconductor substrate, the adhesive coating layer, and the support substrate, or a set of the semiconductor substrate, the adhesive coating layer, the releasing agent coating layer, and the support substrate is placed in an atmosphere at 10 to 10,000 Pa. The time of the reduced pressure treatment is generally 1 to 30 minutes.

In a preferred embodiment of the present invention, any of the substrates and any of the coating layer, or coating layers are bonded together preferably through a reduced pressure treatment, more preferably through a heat treatment in combination with a reduced pressure treatment.

No particular limitation is imposed on the load which is applied to the semiconductor substrate and the support substrate in a thickness direction, so long as the semiconductor substrate, the support substrate, and a layer therebetween are not damaged, and these elements are closely adhered. The load is generally 10 to 1,000 N.

The temperature of post-heating is preferably 120° C. or higher from the viewpoint of attaining sufficient curing rate, and preferably 260° C. or lower from the viewpoint of preventing deterioration of the substrates, the adhesive component, the releasing agent component, etc. The heating time is generally 1 minute or longer from the viewpoint of achieving suitable joining of a wafer through curing, preferably 5 minutes or longer from the viewpoint of, for example, stability in physical properties of the adhesive. Also, the heating time is generally 180 minutes or shorter, preferably 120 minutes or shorter, from the viewpoint of avoiding, for example, an adverse effect on the adhesive layer due to excessive heating. Heating may be performed by means of a hot plate, an oven, or the like.

Notably, a purpose of performing post-heating is to more suitably cure the adhesive component (S).

Next will be described the second step of processing the semiconductor substrate of the laminate produced through the aforementioned procedure.

One example of the processing applied to the laminate of the present invention is processing of a back surface of the semiconductor substrate, the surface being opposite the circuit-furnished surface of the semiconductor substrate. Typically, the processing is thinning a wafer by polishing (grinding) the backside thereof. Thereafter, the thinned wafer is provided with through silicon vias (TSVs) and the like and then removed from the support. A plurality of such wafers are stacked to form a wafer laminate, to thereby complete 3-dimensional mounting. Before or after the above process, a backside electrode and the like are formed on the wafer. When thinning of a wafer and the TSV process are performed, a thermal load of 250 to 350° C. is applied to the laminate bonded to the support. The laminate of the present invention including the adhesive layer has heat resistance to the load.

In one mode of thinning, the backside surface (a surface opposite the circuit-furnished surface) of a wafer having a diameter of about 300 mm and a thickness of about 770 μm is polished (ground), whereby the thickness of the wafer can be reduced to about 80 to about 4 μm.

Next will be described the third step of separating the processed semiconductor substrate and the adhesive layer from the support substrate.

In the third step, the processed semiconductor substrate and the adhesive layer are separated from the support substrate. In the separation process, when the laminate includes a release layer, the release layer is generally removed with the support substrate.

No particular limitation is imposed on the method of separating the processed semiconductor substrate and the adhesive layer from the semiconductor substrate, so long as debonding occurs between the adhesive layer and the release layer or the support substrate, in contact with the adhesive layer. No particular limitation is imposed on the debonding method, and examples include debonding with laser light, mechanical debonding by means of a machine member having a sharp part, and manual peeling.

Next will be described the fourth step of removing the adhesive layer on the processed semiconductor substrate and cleaning the processed semiconductor substrate.

In the fourth step, the adhesive layer on the semiconductor substrate is removed through the cleaning method of the present invention. Specifically, the adhesive layer on, for example, a thinned substrate is efficiently removed through the cleaning method of the present invention. The conditions involved therein are described above.

After carrying out the fourth step, if required, an adhesive layer residue remaining on the semiconductor substrate may be removed by use of a cleaning agent composition containing a salt component. This post-cleaning must be carefully conducted so as not to give damage to the semiconductor substrate, particularly bumps of a semiconductor substrate having the bumps.

The processed semiconductor substrate production method of the present invention includes the aforementioned first to fourth steps. However, the production method may further include an additional step other than the first to fourth steps. The aforementioned technical and methodological elements involved in the first to fourth steps may be modified in various manners, so long as the modification does not deviate from the gist of the present invention.

EXAMPLES

The present invention will be described in detail by way of the Examples and Comparative Examples. However, the Examples should not be construed as limiting the invention thereto. Notably, the apparatuses as well as the solvent used in the remover compositions with purities determined through gas chromatography are as follows.

[Apparatuses]
(1) Agitator: Planetary centrifugal mixer ARE-500 (product of Thinky Corporation)
(2) Viscometer: Rotary viscometer TVE-22H (product of Toki Sangyo Co., Ltd)
(3) Agitator: Mix Roter Variable 1-1186-12 (product of As One Corporation)
(4) Optical microscope: Semiconductor/FPD inspection microscope MX61L (product of Olympus Corporation)

[Solvents]
N-Methylpyrrolidone: product of Kanto Chemical Co., Inc., purity >99.0%
Mesitylene: product of FUJIFILM Wako Pure Chemical Corporation, purity >97.0%
p-Cymene: product of Tokyo Chemical Industry Co., Ltd., purity >95.0%
1,2,4-Trimethylbenzene: product of Tokyo Chemical Industry Co., Ltd., purity >98.0%
1,4-Diisopropylbenzene: product of Tokyo Chemical Industry Co., Ltd., purity >98.0%
Toluene: product of Tokyo Chemical Industry Co., Ltd., purity >99.5%

[1] Preparation of Adhesive Composition

Preparation Example 1

To a 600-mL agitation container dedicated for a planetary centrifugal mixer, an MQ resin having vinyl groups (product of WACKER Chemie AG) (a1) (95 g), p-menthane (product of Nippon Terpene Chemicals, Inc.) (93.4 g) serving as a solvent, and 1,1-diphenyl-2-propyn-1-ol (product of Tokyo Chemical Industry Co., Ltd.) (A2) (0.41 g) were added, and the resultant mixture was agitated for 5 minutes by means of a planetary centrifugal mixer.

To the thus-prepared mixture, there were added linear-chain polydimethylsiloxane having Si—H groups (viscosity: 100 mPas) (product of WACKER Chemie AG) (a2) (19.0 g), linear-chain polydimethylsiloxane having vinyl groups (viscosity: 200 mPas) (product of WACKER Chemie AG) (a1) (29.5 g), polyorganosiloxane (polydimethylsiloxane, viscosity: 1,000,000 $mm^2/s$) (AK1000000, product of WACKER Chemie AG) (B) (65.9 g), and 1-ethynyl-1-cyclohexanol (product of WACKER Chemie AG) (A3) (0.41 g), and the resultant mixture was further agitated for 5 minutes by means of a planetary centrifugal mixer.

Separately, a platinum catalyst (product of WACKER Chemie AG) (A2) (0.20 g) and linear-chain polydimethylsiloxane having vinyl groups (viscosity: 1,000 mPas) (product of WACKER Chemie AG) (a1) (17.7 g) were agitated for 5 minutes by means of a planetary centrifugal mixer. Then, a portion (14.9 g) of the thus-agitated mixture was added to the above-prepared mixture, and the resultant mixture was further agitated for 5 minutes by means of the planetary centrifugal mixer. Finally, the product mixture was filtered through a nylon filter (300 mesh), to thereby prepare an adhesive composition.

[2] Fabrication of Substrates for Evaluation of Cleaning Performance

Production Example 1

The composition prepared in Preparation Example 1 was applied, by means of a spin-coater, onto an Si wafer (4 cm×4 cm, thickness: 775 μm) serving as a device-side wafer. The thus-coated wafer was heated by a hot plate at 120° C. for 1.5 minutes, then at 200° C. for 10 minutes, to thereby form a thin film (thickness: 60 μm) on the wafer. Thus, a wafer having an adhesive layer was produced.

Production Example 2

A substrate provided with bumps was cut to prepare sample substrates (4 cm×4 cm). Each sample substrate had 5,044 bumps. Each bump had a pillar formed of copper, a cap formed of tin-silver (Ag: 1.8 mass %), and a portion between the pillar and the cap, the portion being formed of nickel.

[3] Measurement of Time for Adhesive Layer Separation

Example 1-1

The wafer having an adhesive layer produced in Production Example 1 was immersed in mesitylene (9 mL), serving as a remover composition of Example 1-1. The time required for initiating separation of the adhesive layer from the wafer was measured to be 18 seconds.

Example 1-2

The wafer having an adhesive layer produced in Production Example 1 was immersed in a solvent mixture of mesitylene and N-methylpyrrolidone (9:1 (w/w)) (9 mL), serving as a remover composition of Example 1-2. The time required for initiating separation of the adhesive layer from the wafer was measured to be 24 seconds.

Comparative Example 1

The wafer having an adhesive layer produced in Production Example 1 was immersed in a solvent mixture of mesitylene and N-methylpyrrolidone (7:3 (w/w)) (9 mL), serving as a remover composition of Comparative Example 1. The time required for initiating separation of the adhesive layer from the wafer was measured to be 49 seconds.

Example 2-1

The wafer having an adhesive layer produced in Production Example 1 was immersed in p-cymene (9 mL), serving as a remover composition of Example 2-1. The time required for initiating separation of the adhesive layer from the wafer was measured to be 18 seconds.

Example 2-2

The wafer having an adhesive layer produced in Production Example 1 was immersed in a solvent mixture of p-cymene and N-methylpyrrolidone (9:1 (w/w)) (9 mL), serving as a remover composition of Example 2-2. The time required for initiating separation of the adhesive layer from the wafer was measured to be 24 seconds.

Comparative Example 2

The wafer having an adhesive layer produced in Production Example 1 was immersed in a solvent mixture of p-cymene and N-methylpyrrolidone (7:3 (w/w)) (9 mL), serving as a remover composition of Comparative Example 2. The time required for initiating separation of the adhesive layer from the wafer was measured to be 52 seconds.

Example 3

The wafer having an adhesive layer produced in Production Example 1 was immersed in 1,2,4-trimethylbenzene (9 mL), serving as a remover composition of Example 3. The time required for initiating separation of the adhesive layer from the wafer was measured to be 18 seconds.

Comparative Example 3

The wafer having an adhesive layer produced in Production Example 1 was immersed in 1,4-diisopropylbenzene (9 mL), serving as a remover composition of Comparative Example 3. The time required for initiating separation of the adhesive layer from the wafer was measured to be 44 seconds.

Example 4

The wafer having an adhesive layer produced in Production Example 1 was immersed in toluene (9 mL), serving as a remover composition of Example 4. The time required for initiating separation of the adhesive layer from the wafer was measured to be 9 seconds.

The results of Examples and Comparative Examples are shown in Table 1. As is clear from Table 1, when a remover composition in which the solvent included an organic solvent represented by formula (L) (e.g., mesitylene or p-cymene) in an amount of 80 mass % or more was used (Examples 1-1 to 4), the time required for initiating separation of the adhesive layer from the semiconductor substrate was remarkably shorter, as compared with the cases of using a remover composition having a formula (L) organic solvent content less than 80 mass % (Comparative Examples 1 and 2) and using a remover composition containing no organic solvent represented by formula (L) and instead containing 1,4-diisopropylbenzene having almost the same number of carbon atoms, which compound was a structural analog with respect to the organic solvent (Comparative Example 3).

TABLE 1

| | Solvent | Time to separation (s) |
| --- | --- | --- |
| Ex. 1-1 | Mesitylene | 18 |
| Ex. 1-2 | Mesitylene/N-methylpyrrolidone (9/1 (w/w)) | 24 |
| Comp. Ex. 1 | Mesitylene/N-methylpyrrolidone (7/3 (w/w)) | 49 |
| Ex. 2-1 | p-Cymene | 18 |
| Ex. 2-2 | p-Cymene/N-methylpyrrolidone (9/1 (w/w)) | 24 |
| Comp. Ex. 2 | p-Cymene/N-methylpyrrolidone (7/3 (w/w)) | 52 |
| Ex. 3 | 1,2,4-Trimethylbenzene | 18 |
| Comp. Ex. 3 | 1,4-Diisopropylbenzene | 44 |
| Ex. 4 | Toluene | 9 |

[4] Observation of Damage to Bumps of Substrate

Example 5

The sample substrates produced in Production Example 2 were immersed in mesitylene (9 mL) and allowed to stand for 1 hour. Then, each substrate was washed with isopropanol and acetone, and observed under an optical microscope, to thereby observe bumps. Through microscopic observation, no damage was confirmed in the bumps.

Comparative Example 4

Tetrabutylammonium fluoride trihydrate (product of Kanto Chemical Co., Inc.) (2 g) and mesitylene (18 g) were agitated together at room temperature by means of a mixing rotor. However, a portion of tetrabutylammonium fluoride remained undissolved. Thus, a supernatant of the resultant mixture was recovered.

Subsequently, the sample substrates produced in Production Example 2 were immersed in the above-recovered supernatant (9 mL) for 1 hour. Then, each substrate was washed with isopropanol and acetone, and observed under an optical microscope, to thereby observe bumps. Through microscopic observation, damaged bumps were confirmed in the entire area of the sample substrate (estimated number of bumps: 1,000 to 2,000).

The invention claimed is:

1. A semiconductor substrate cleaning method comprising removing an adhesive layer provided on a semiconductor substrate by use of a remover composition, wherein:
   the adhesive layer is a film formed by use of an adhesive composition that contains an adhesive component (S), and the adhesive component (S) comprises a siloxane adhesive containing a polyorganosiloxane component (A) that is curable through hydrosilylation;
   the remover composition contains a solvent but no salt; and
   the solvent includes an organic solvent represented by formula (L) in an amount of 80 mass % or more:

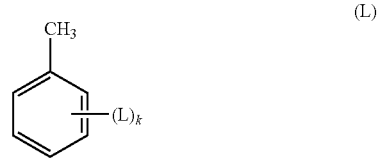

where:
   L represents a substituent to the benzene ring, and each of a plurality of Ls represents a C1 to C4 alkyl group; and
   k represents the number of Ls and is an integer of 0 to 5.

2. The semiconductor substrate cleaning method according to claim 1, wherein the solvent includes the organic solvent represented by formula (L) in an amount of 85 mass % or more.

3. The semiconductor substrate cleaning method according to claim 2, wherein the solvent is formed of the organic solvent represented by formula (L).

4. The semiconductor substrate cleaning method according to claim 1, wherein L is a methyl group or an isopropyl group.

5. The semiconductor substrate cleaning method according to claim 1, wherein the organic solvent represented by formula (L) is at least one species selected from among toluene, mesitylene, p-cymene, and 1,2,4-trimethylbenzene.

6. The semiconductor substrate cleaning method according to claim 1, wherein the adhesive component(S) further comprises at least one species selected from an acrylic resin adhesive, an epoxy resin adhesive, a polyamide adhesive, a polystyrene adhesive, a polyimide adhesive, and a phenolic resin adhesive.

7. A processed semiconductor substrate production method comprising:
   producing a laminate having a semiconductor substrate, a support substrate, and an adhesive layer formed from an adhesive composition;
   processing the semiconductor substrate of the produced laminate;
   separating the semiconductor substrate and the adhesive layer from the support substrate; and
   removing the adhesive layer on the semiconductor substrate by use of a remover composition,
   wherein;
   the adhesive layer is a film formed by use of an adhesive composition that contains an adhesive component(S), and the adhesive component(S) comprises a siloxane adhesive containing a polyorganosiloxane component (A) that is curable through hydrosilylation;
   the remover composition contains a solvent but no salt; and
   the solvent includes an organic solvent represented by formula (L) in an amount of 80 mass % or more:

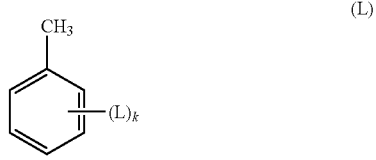
(L)

where:
   L represents a substituent to the benzene ring, and each of a plurality of Ls represents a C1 to C4 alkyl group; and
   k represents the number of Ls and is an integer of 0 to 5.

8. The processed semiconductor substrate production method according to claim 7, wherein the solvent includes the organic solvent represented by formula (L) in an amount of 85 mass % or more.

9. The processed semiconductor substrate production method according to claim 8, wherein the solvent is formed of the organic solvent represented by formula (L).

10. The processed semiconductor substrate production method according to claim 7, wherein L is a methyl group or an isopropyl group.

11. The processed semiconductor substrate production method according to claim 10, wherein the organic solvent represented by formula (L) is at least one species selected from among toluene, mesitylene, p-cymene, and 1,2,4-trimethylbenzene.

12. The processed semiconductor substrate production method according to claim 7, wherein the adhesive component(S) further comprises at least one species selected from an acrylic resin adhesive, an epoxy resin adhesive, a polyamide adhesive, a polystyrene adhesive, a polyimide adhesive, and a phenolic resin adhesive.

13. A remover composition for use in removal of an adhesive layer provided on a semiconductor substrate during cleaning the semiconductor substrate, which composition contains a solvent but no salt, wherein:
   the adhesive layer is a film formed by use of an adhesive composition that contains an adhesive component(S), and the adhesive component(S) comprises a siloxane adhesive containing a polyorganosiloxane component (A) that is curable through hydrosilylation;
   the solvent includes an organic solvent represented by formula (L) in an amount of 80 mass % or more:

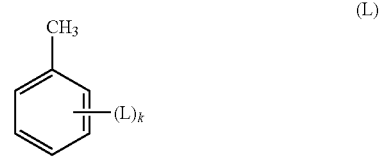
(L)

where:
   L represents a substituent to the benzene ring, and each of a plurality of Ls represents a C1 to C4 alkyl group; and
   k represents the number of Ls and is an integer of 0 to 5.

14. The remover composition according to claim 13, wherein the solvent includes the organic solvent represented by formula (L) in an amount of 85 mass % or more.

15. The remover composition according to claim 14, wherein the solvent is formed of the organic solvent represented by formula (L).

16. The remover composition according to claim 13, wherein L is a methyl group or an isopropyl group.

17. The remover composition according to claim 16, wherein the organic solvent represented by formula (L) is at least one species selected from among toluene, mesitylene, p-cymene, and 1,2,4-trimethylbenzene.

18. The remover composition according to claim 13, wherein the adhesive component(S) further comprise at least one species selected from an acrylic resin adhesive, an epoxy resin adhesive, a polyamide adhesive, a polystyrene adhesive, a polyimide adhesive, and a phenolic resin adhesive.

* * * * *